(12) United States Patent
Bunce et al.

(10) Patent No.: US 7,102,944 B1
(45) Date of Patent: Sep. 5, 2006

(54) PROGRAMMABLE ANALOG CONTROL OF A BITLINE EVALUATION CIRCUIT

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/056,049

(22) Filed: Feb. 11, 2005

(51) Int. Cl.
*G11C 7/00* (2006.01)
(52) U.S. Cl. .................... 365/204; 365/154; 365/156
(58) Field of Classification Search .............. 365/204, 365/154, 156, 189.05
See application file for complete search history.

(56) References Cited

U.S. PATENT DOCUMENTS 5,434,822 A * 7/1995 Deleganes et al. .......... 365/203
6,178,118 B1 * 1/2001 Lin et al. ............... 365/185.28
6,657,886 B1 12/2003 Aipperspach et al.

* cited by examiner

*Primary Examiner*—Richard Elms
*Assistant Examiner*—Dang Nguyen
(74) *Attorney, Agent, or Firm*—Lynn L. Augsperger; Cantor Colburn LLP (57) ABSTRACT

The invention may comprise circuit for programmable control of a discharge deactivation signal when interfacing local bitlines to a global bitline or other circuit. The invention may also comprise a method for programmable ground circuit control for control of a discharge signal deactivation when interfacing local bitlines to a global bitline via a bitline evaluation discharge device comprising: providing input logic states to inputs of a controller circuit; outputting an adjustable ground value from the controller circuit; and controlling the bitline evaluation discharge device with the adjustable ground value.

1 Claim, 7 Drawing Sheets

| mrgn2 | mrgn1 | Setting |
|---|---|---|
| 0 | 0 | P24 is conducting and N21 is not conducting. "bias" at "1" logic level. Distributed N20 forms a low impedance to ground. Distributed P23 is off. "vmgrn" is virtually ground. This is the default state where "pren" mimics a nominal local bitline. |
| 0 | 1 | P24 and N21 are both conducting. "bias" is at a mid logic level. This causes "pren" to fall later and more slowly than the default case. "pren" does not reach a full ground level. Only extremely weak cells are unable to read. |
| 1 | 0 | Illegal state. P24 and N21 are not conducting. This would cause an indeterminate state on "bias" because it is a floating node. |
| 1 | 1 | P24 is not conducting and N21 is conducting. N20 is now connected as a diode. "vmrgn" can only reach a low level of Vt above ground. At this setting, marginally weak cells and extremely weak cell will be unable to read. |

FIG. 6

ND STAGE EVAL and a second stage inverter that pro-
PROGRAMMABLE ANALOG CONTROL OF A BITLINE EVALUATION CIRCUIT

FIELD OF THE INVENTION

This invention relates to accessing memory arrays, and in particular, to a circuit for controlling the bitline evaluation associated with reading memory arrays.

BACKGROUND

Figure 1A:
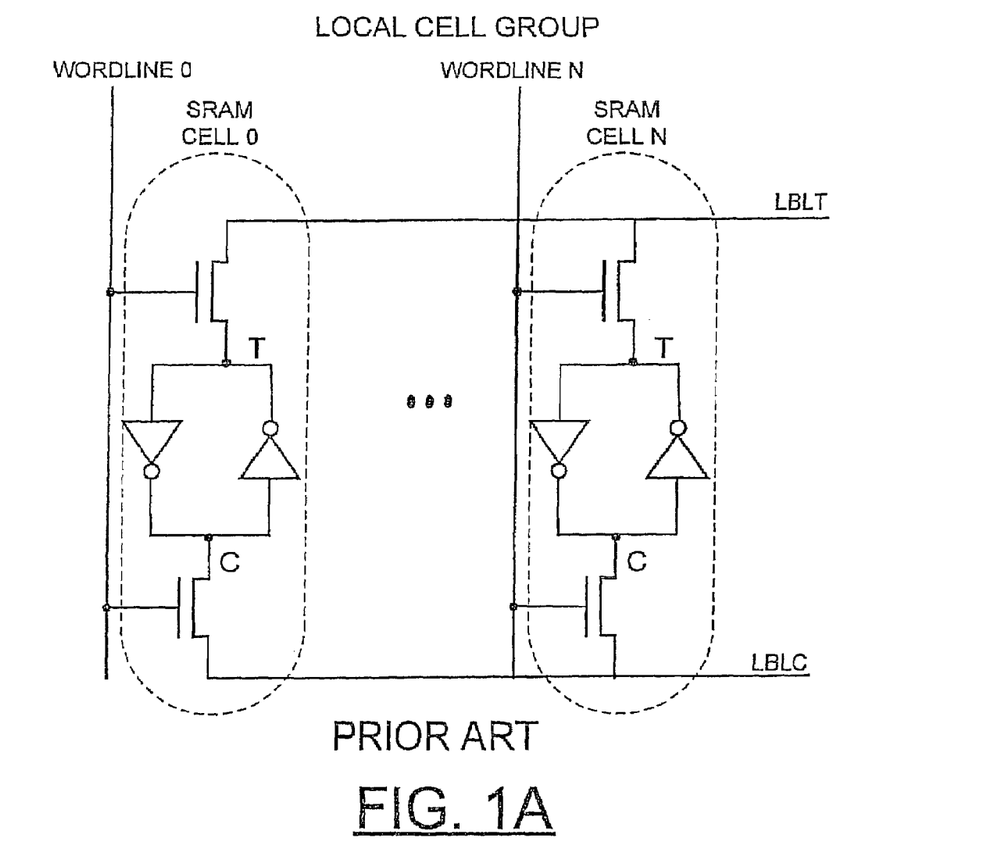
FIG. 1A illustrates an exemplary conventional SRAM cell.
Figure 1B:
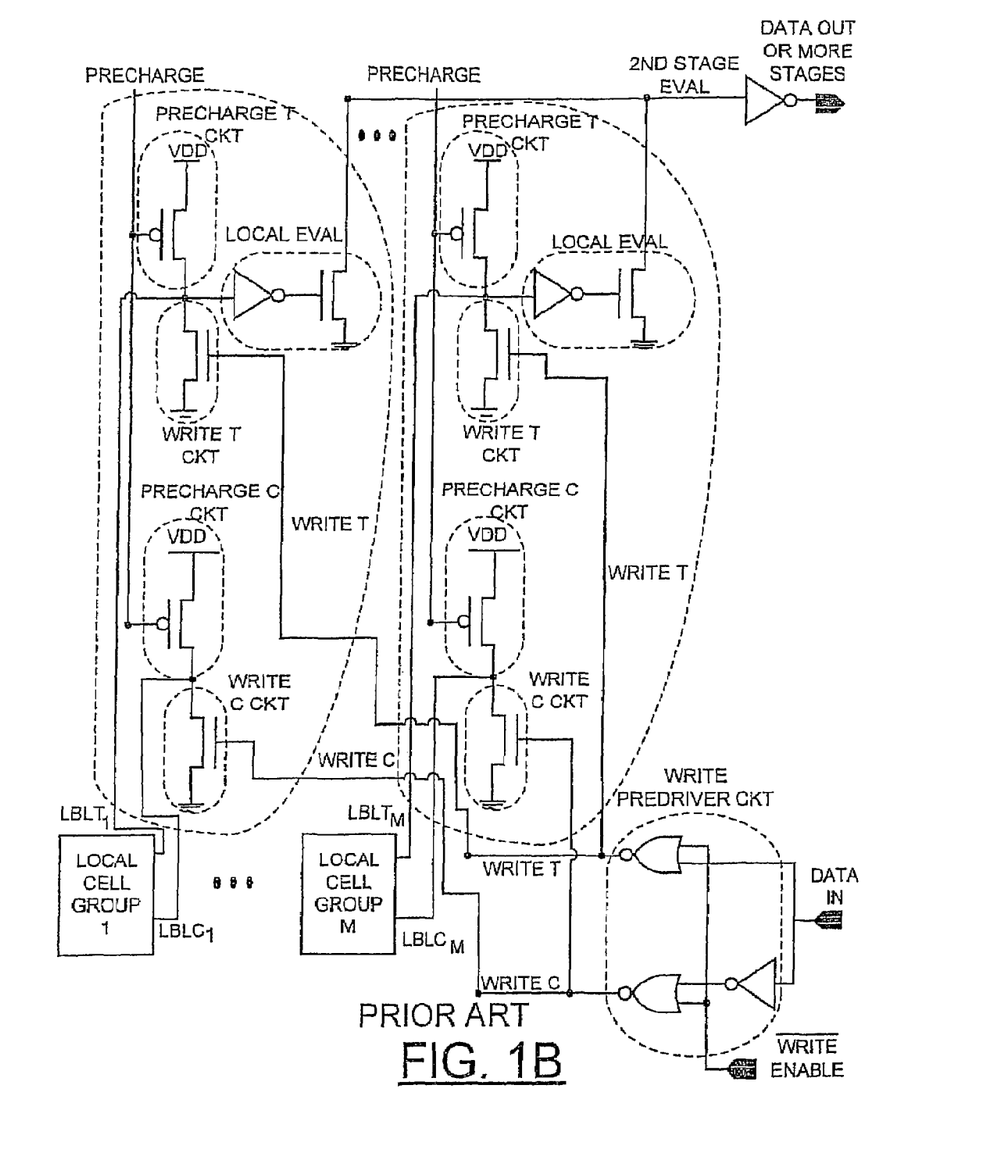
FIG. 1B illustrates an exemplary domino SRAM.

FIGS. 1A and 1B illustrate a high performance, low power domino SRAM design including multiple local cell groups such as that shown in U.S. Pat. No. 6,657,886, the entire contents of which are incorporated herein by reference. As shown in FIG. 1A, each cell group includes multiple SRAM cells 1–N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to wordline NFETs. A particular WORDLINE is activated, turning on respective wordline NFETs to perform a read or write operation.

For arrays of sufficient size, as shown in FIG. 1B, the prior art domino SRAM includes multiple local cell groups 1–M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

SUMMARY OF THE INVENTION

Embodiments of the invention may include a circuit for programmable control of bitline evaluation when interfacing local bitlines to a global bitline or other circuit, the circuit comprising a first PFET device having an input coupled to a first local bitline in a first memory sub-array; and optionally, a second PFET device having an input coupled to a second local bitline in a second memory sub-array; an evaluation line coupled to an output of the first device and (optionally) coupled to an output of the second device; a discharge device coupled to the evaluation line, the discharge device coupling the evaluation line to ground as a pulldown in response to a discharge signal; and an output device having an input coupled to the evaluation line and an output coupled to the global bitline or other circuit.

An embodiment may also comprise a programmable ground circuit for control of a discharge signal deactivation when interfacing local bitlines to a global bitline via a discharge device, the programmable ground circuit comprising: a first programmable input line connected to a gate of a first PFET; a second programmable input line connected to a gate of a first NFET; and a default ground line connected to a second NFET; a power supply connected to second PFET; a first line connecting a drain electrode of the first PFET to a drain electrode of the first NFET; a second line connecting the first line to a gate of the second PFET; a third line connecting the second line to the gate of the second NFET; a central node connecting the second NFET to the second PFET; a fourth line connecting the first NFET to the central node; and a power supply connected to the first PFET; wherein the output on the central node provides a programmable ground value so that input logic states of the programmable input lines enable one programmable ground output state to be used for a discharge signal deactivation value to be sent to a discharge device.

The invention may also comprise a method for programmable ground circuit control for control of a discharge signal deactivation when interfacing local bitlines to a global bitline via a bitline discharge device comprising: providing input logic states to inputs of a controller circuit; outputting an adjustable ground value from the controller circuit; and controlling the bitline discharge device with the adjustable ground value.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The foregoing and other features, and advantages of the invention are apparent from the following detailed description taken in conjunction with the accompanying drawings. Embodiments will now be described, by way of example only, with reference to the accompanying drawings which are meant to be exemplary of various embodiments, and not intended to be limiting in any way, in several Figures, in which.

The detailed description explains the preferred embodiments of the invention, together with advantages and features, by way of example with reference to the drawings.

DETAILED DESCRIPTION OF THE INVENTION

Figure 2:
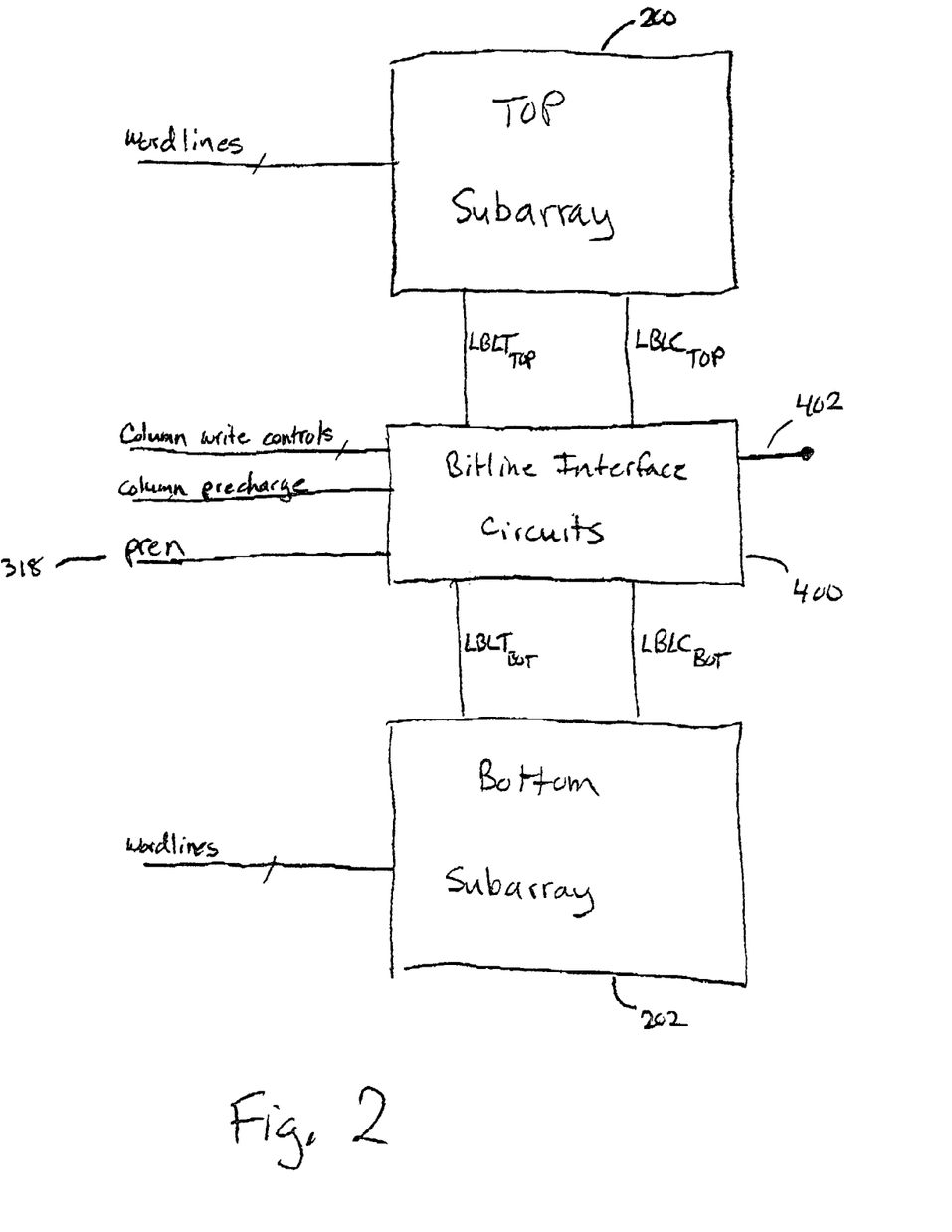
FIG. 2 is a block diagram of a memory array with two subarrays.

FIG. 2 is a block diagram of an exemplary embodiment of a memory array comprising two subarrays and bitline interface circuitry for use with a memory array. The memory array is divided into a top subarray 200 and a bottom subarray 202. Bitline interface circuits 400 access the top subarray 200 or the bottom subarray 202 over bitlines LBLTtop, LBLCtop, LBLTbot and LBLCbot and output a global bitline or other signal line 402.

Figure 3:
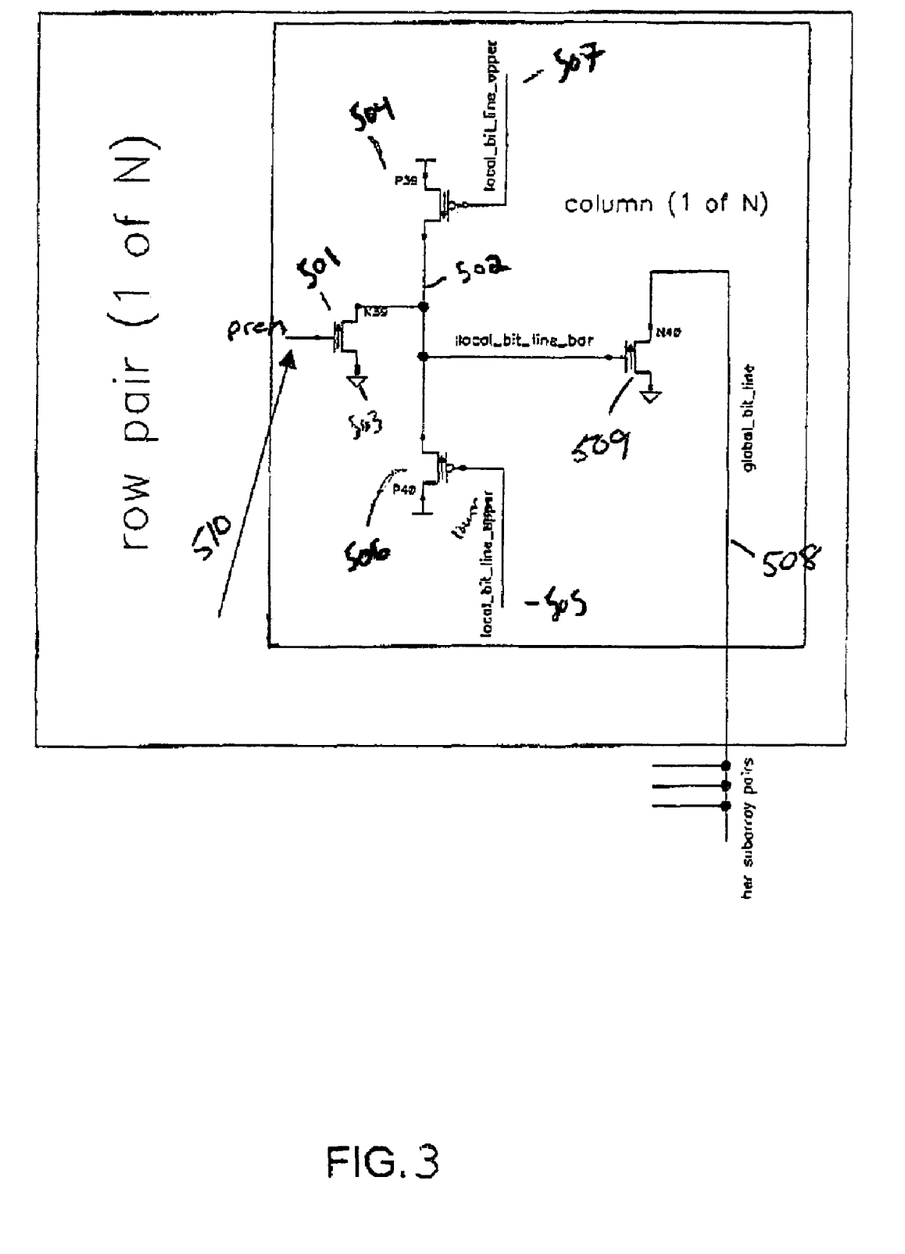
FIG. 3 depicts a control of bitline evaluation discharge.

FIG. 3 depicts a local to global bitline interface in an exemplary embodiment. The global bitline 508 is connected to the local bitlines 505 and 507 through PFET devices 504 and 506, respectively. Either the top subarray is read or the bottom subarray is read, but not both at the same time. The global bitline is precharged to a logic 1.

The local bitlines from the top and the bottom sub-arrays are connected to the inputs (e.g., gate node) of PFETs 504 and 506. Outputs (e.g., drain nodes) of the PFETs 504 and 506 are connected to an evaluation line 502. An NFET global output device 509 has an input (e.g., gate node) coupled to the evaluation line 502 and an output (e.g., drain node) driving to the global bit line 508. When the discharge signal "pren" 510 is high, NFET discharge device 501 pulls the evaluation line 502 to ground preventing output on the global bitline 508. When discharge signal is low, the output at global bitline 508 is controlled by one of PFET 504 and PFET 506. When the top subarray cell stores a logic 0, PFET 504 is conductive and drives evaluation line 502 high. This causes NFET global output device 509 to turn on and couple the global bit line 508 to ground. When the top subarray cell stores a logic 1, PFET 504 is not conductive, and the global bitline 508 remains precharged to a logic 1. Cells in the bottom subarray operate in a similar manner.

The method of deactivating the discharge signal 510 is designed to mimic a nominal bitline slew. This helps to block early reads where the local bitline slew is faster, since NFET 501 remains active while discharge signal 510 is high. In effect, this slows down the reading of these fast cells since evaluation line 502 cannot respond as quickly to a bitline (507 or 505) falling as compared to the case where NFET 501 is non-conducting. Since the discharge signal 510 has shut NFET 501 off by the time a slow cell drives the local bitline low, these slower cell will read faster because PFET 504 can drive the evaluation line more quickly when NFET 501 is non-conducting. Hence, the access time variability between fast and slow cells is improved. The method of deactivating the discharge signal also helps to suppress false reads caused by leakage or noise on unselected local bitlines.

Figure 4:
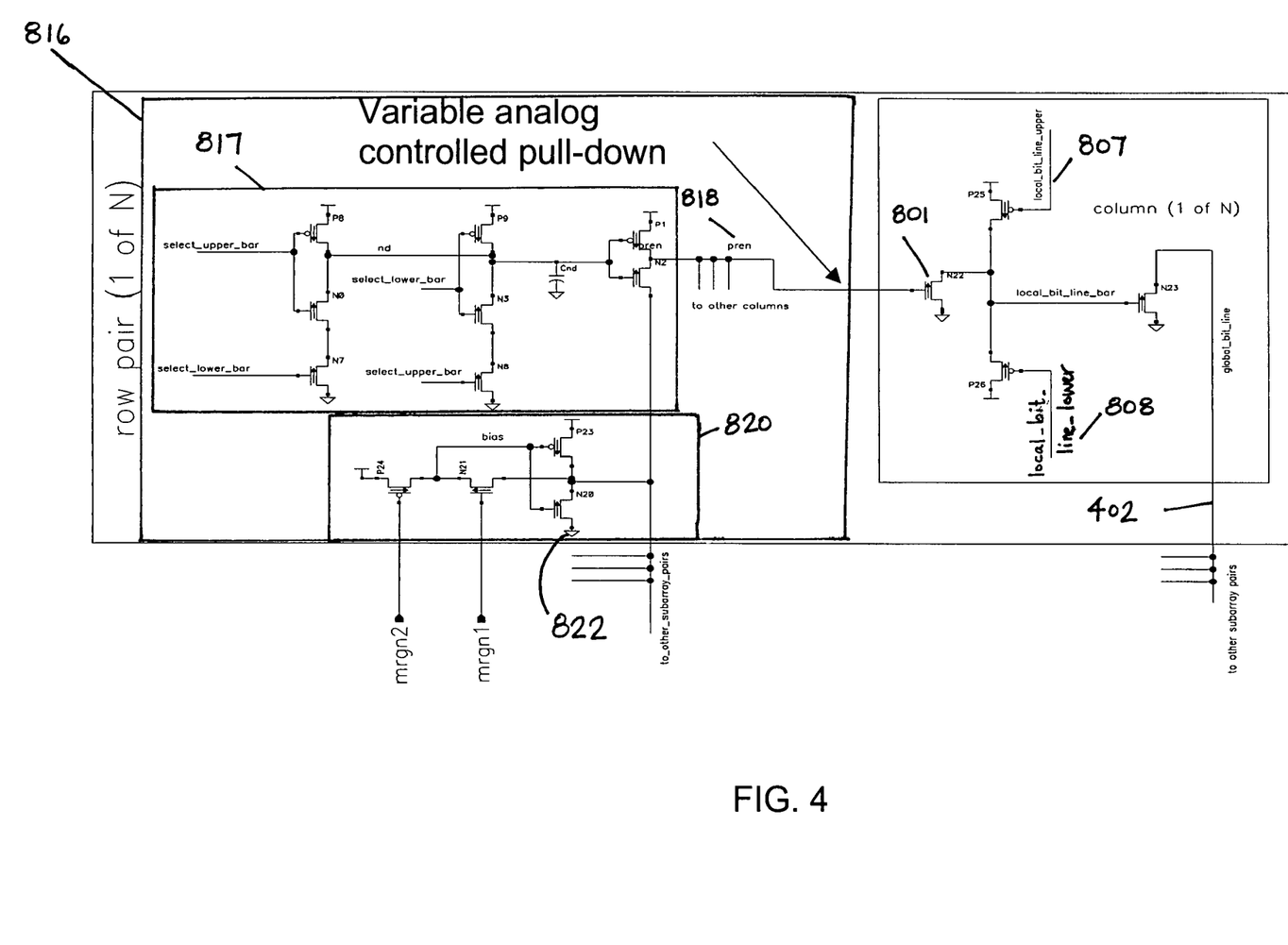
FIG. 4 depicts a preferred embodiment circuit.

Thus, turning to the present preferred embodiment shown in FIG. 4, it can be seen that a circuit 816 is provided which provides a variable, analog, controlled discharge signal 818 or pren that controls the switching characteristics of (turns on) NFET 801. This provides greater control over the bitline evaluation timing and/or slew rate so that slow and marginally slow SRAM cells can be detected by their failure to read as explained further below in reference to FIG. 6. Thus, slower SRAM cells can be identified with circuit 816 as shown in FIG. 4 for example.

Figure 5:
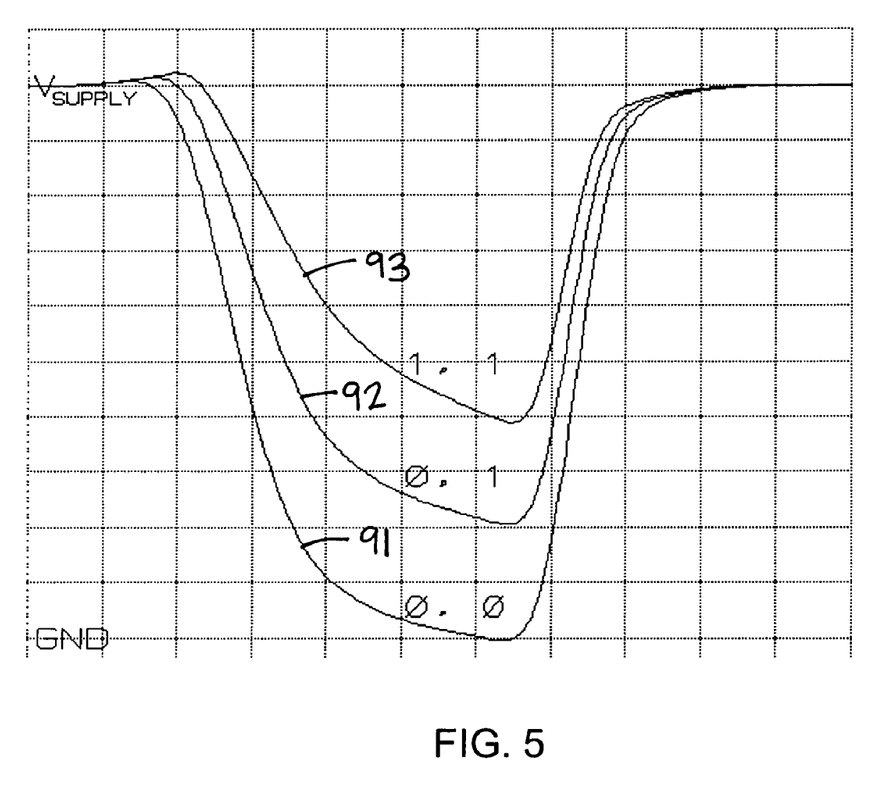
FIG. 5 depicts a graph of exemplary output values for pren.

The circuit 816 in FIG. 4 has been divided into boxes for understanding. Box 817 contains a balanced AND arrangement which is provides a logical AND function. Box 820 contains the variable and programmable ground circuit of the preferred embodiment, and is shown to have inputs mrgn1 and mrgn2 as well as the default ground 822. To understand the useful features that programmable ground 820 circuit enables, a truth table is provided in FIG. 6 and a corresponding voltage graph of pren is shown in FIG. 5.

Figure 6:
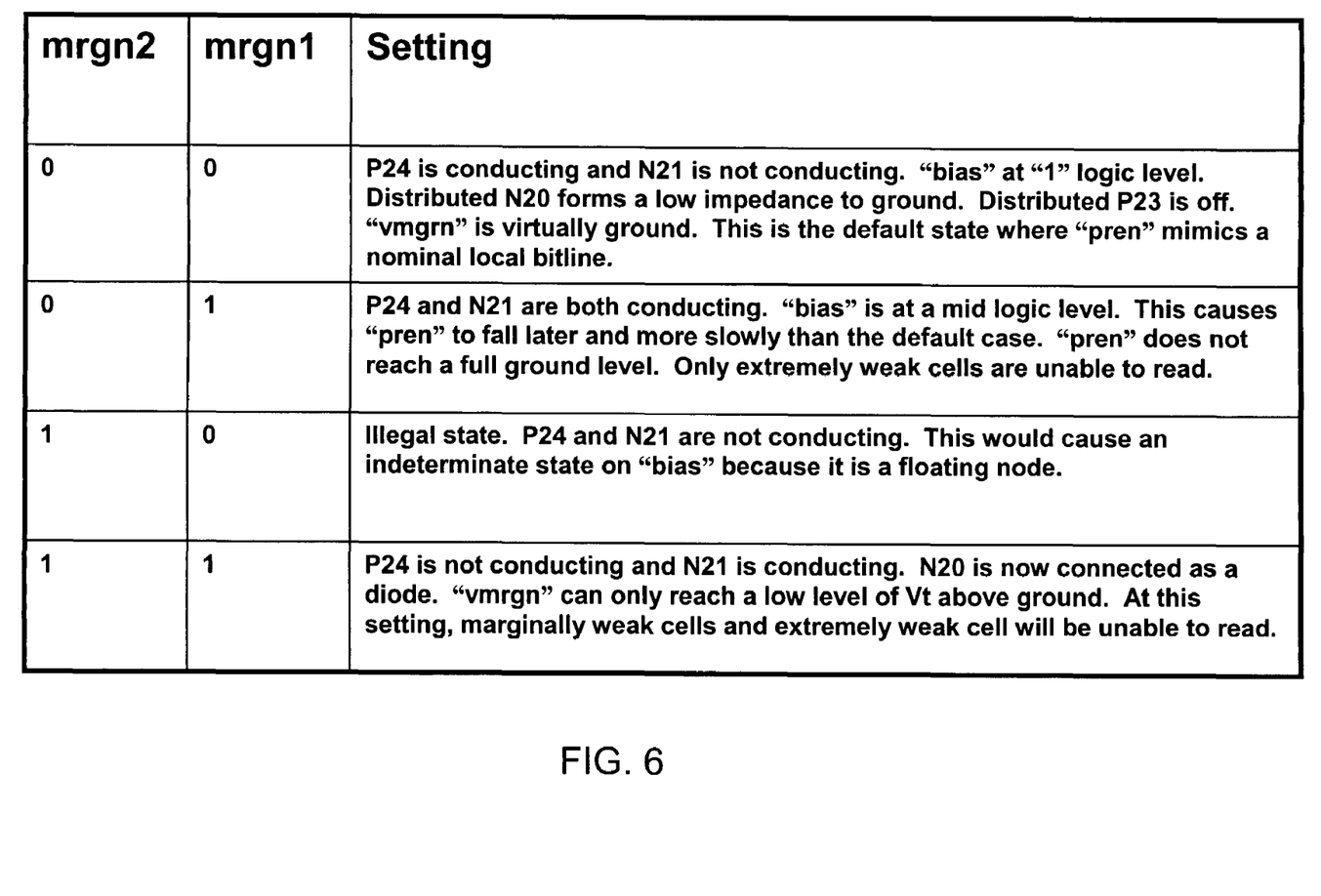
FIG. 6 is an example of a possible truth table for a programmable ground.

Turning to FIG. 6, the inputs to mrgn2 and mgrn1 are shown in a truth table. Thus, by programming the programmable ground circuit 820 different features are available and programmable analog control of bitline discharge (pren) 818 is enabled which is very useful and which is not possible in the DC or digital control embodiments described above.

Thus, it shown in the first row of FIG. 6 that when mrgn2 is "0" and mrgn1 is "0" PFET P24 is conducting and NFET N21 is not conducting. The "bias" shown will be at "1" logic level. Distributed NFET N20 forms a low impedance to ground 822. Distributed PFET P23 is off and "vmgrn" is virtually ground. This is the default state where "pren" mimics a nominal local bitline. This is similar in performance to the digital control described above.

It is shown in the second row of FIG. 6 that when mrgn2 is "0" and mrgn1 is "1" that PFET P24 and NFET N21 are both conducting. The "bias" is at a mid logic level. This causes "pren" to fall (deactivate) later and more slowly than the default case. In fact, in this case "pren" does not reach a full ground level. Thus, weak cells may be unable to complete a read operation. Referring to FIG. 4, a weak cell would cause the local bit line (807 or 808) to fall more slowly than a nominal cell. Depending on performance requirements, a weak cell driving the local bit line may not be able to drive the local bit line (807 or 808) to a full "0" logic level (ie. ground.) As such, the strength of the PFET (P25 or P26) is reduced. Since "pren" (818) is not allowing NFET (801) to quickly and completely turn off, bitline evaluation performance is slowed and may not sufficiently turn on NFET (N23) to drive the global bit line (402) and successfully read data.

It is shown in the third row of FIG. 6 that when mrgn2 is "1" and mrgn1 is "0" an illegal state occurs because PFET P24 and N21 are not conducting. This would cause an indeterminate state on the "bias" because it is a floating node. Therefore, this state is not used.

Lastly, it is shown in the fourth row of FIG. 6 that when mrgn2 is "1" and mrgn1 is "1" PFET P24 is not conducting and NFET N21 is conducting. NFET N20 is now connected as a diode and "vmrgn" can only reach a low level of Vt (threshold voltage) above ground. At this setting, NFET (801) is stronger than at the setting of 0,1. Thus, the bitline evaluation performance and level are further degraded resulting in potentially more cells failing to successfully read data.

Thus, as shown in FIG. 5 by the graphical plots of the pren node values, there are three valid and useable conditions (91, 92, 93) as discussed above in reference to FIG. 6. Specifically, pren node voltage value 91 is 0.0 and corresponds to the "0,0" case shown in row 1 of FIG. 6. This is the default case. However, by turning to the "0,1" case in row two of FIG. 6 it can be seen how this different pren node shown by 92 in FIG. 5 value is useful by comparing 91 to 92. In 92, the pren value falls (deactivates) slower and later than in default case 91. 92 also does not reach a full ground level. Thus, if the "0,1" setting is used extremely weak cells are able to be identified or "weeded out" because they will be unable to read. Likewise, if the "1,1" case in row four of FIG. 6 is used in the programmable ground circuit 820 as mrgn2 and mrgn1 values, respectively, then as shown by graph 93 in FIG. 5, pren 93 falls even more slowly than pren 92 and only falls to a level of a threshold voltage above ground.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A programmable ground circuit for control of a bitline evaluation when interfacing local bitlines to a global bitline or other circuit via a discharge device, the programmable ground circuit comprising:
   a first programmable input line connected to a gate of a first PFET;
   a second programmable input line connected to a gate of a first NFET;
   a default ground line connected to a second NFET;
   a first power supply connected to a second PFET;
   a first line connecting a drain electrode of the first PFET to a drain electrode of the first NFET;
   a second line connecting the first line to a gate of the second PFET;
   a third line connecting the second line to the gate of the second NFET;
   a central node connecting the second NFET to the second PFET;
   a fourth line connecting the first NFET to the central node; and
   a second power supply connected to the first PFET;
   wherein the output on the central node provides a programmable ground value so that input logic states of the programmable input lines enable one programmable ground output state to be used for a zero state voltage level to be sent to a discharge device.

* * * * *